United States Patent
Gao et al.

(10) Patent No.: US 7,859,069 B2
(45) Date of Patent: Dec. 28, 2010

(54) MAGNETIC STORAGE ELEMENT WITH STORAGE LAYER MAGNETIZATION DIRECTED FOR INCREASED RESPONSIVENESS TO SPIN POLARIZED CURRENT

(75) Inventors: Kaizhong Gao, Eden Prairie, MN (US); Haiwen Xi, Prior Lake, MN (US); Yiming Shi, St. Paul, MN (US); Song S. Xue, Edina, MN (US); Sining Mao, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/724,740

(22) Filed: Mar. 16, 2007

(65) Prior Publication Data

US 2008/0225584 A1    Sep. 18, 2008

(51) Int. Cl.
*G11C 11/15* (2006.01)
(52) U.S. Cl. .................. 257/421; 365/171; 365/173
(58) Field of Classification Search ............ 257/295, 257/421; 360/322; 365/158, 173, 200, 157, 365/171
See application file for complete search history.

(56) References Cited

U.S. PATENT DOCUMENTS

| | | | |
|---|---|---|---|
| 5,982,660 A * | 11/1999 | Bhattacharyya et al. ..... | 365/173 |
| 6,130,814 A | 10/2000 | Sun | |
| 6,532,164 B2 * | 3/2003 | Redon et al. ................ | 365/97 |
| 6,888,742 B1 | 5/2005 | Nguyen et al. | |
| 6,980,469 B2 * | 12/2005 | Kent et al. ................. | 365/171 |
| 6,982,909 B2 | 1/2006 | Perner et al. | |
| 7,005,691 B2 | 2/2006 | Odagawa et al. | |
| 7,006,375 B2 | 2/2006 | Covington | |
| 2001/0026471 A1 * | 10/2001 | Michijima et al. ......... | 365/173 |
| 2002/0122338 A1 * | 9/2002 | Park et al. ................. | 365/200 |
| 2004/0027853 A1 * | 2/2004 | Huai et al. ................. | 365/158 |
| 2004/0246776 A1 * | 12/2004 | Covington ................. | 365/173 |
| 2007/0063237 A1 * | 3/2007 | Huai et al. ................. | 257/295 |
| 2007/0086120 A1 * | 4/2007 | Shimazawa et al. ........ | 360/322 |

* cited by examiner

*Primary Examiner*—David Vu
*Assistant Examiner*—Suberr Chi
(74) *Attorney, Agent, or Firm*—Fellers, Snider, et al.

(57) ABSTRACT

The present invention relates to a memory cell including a first reference layer having a first magnetization with a first magnetization direction and a second reference layer having a second magnetization with a second magnetization direction substantially perpendicular to the first magnetization direction. A storage layer is disposed between the first reference layer and second reference layer and has a third magnetization direction about 45° from the first magnetization direction and about 135° from the second magnetization direction when the memory cell is in a first data state, and a fourth magnetization direction opposite the third magnetization direction when the memory cell is in a second data state.

17 Claims, 3 Drawing Sheets

US 7,859,069 B2

MAGNETIC STORAGE ELEMENT WITH STORAGE LAYER MAGNETIZATION DIRECTED FOR INCREASED RESPONSIVENESS TO SPIN POLARIZED CURRENT

BACKGROUND

The present invention relates to magnetic storage devices. More particularly, the present invention relates to magnetic random access memory responsive to spin polarized current.

In magnetic random access memory (MRAM), bits are represented by the magnetic configuration of a small volume of ferromagnetic material, and its magnetic state is measured via a magnetoresistive (MR) effect during read-back. The MRAM typically includes a two-dimensional array of cells, with each cell containing one MR element that can store one bit.

Most common MRAM designs employ MR elements that are based on either giant magnetoresistance (GMR) or tunneling magnetoresistance (TMR), where these elements are patterned thin film multilayer structures that include at least one pinned layer and one free layer. These elements are designed so that the free layer has a bistable magnetic configuration that is preferentially aligned along one of two possible anti-parallel directions. Hence, the binary data stored is related to the orientation of the free layer magnetization. The pinned layer magnetization is aligned along only one of the two possible free layer directions, and its role is to provide a fixed reference so that the magnetoresistance reveals the free layer orientation with respect to the pinned layer.

There are numerous ways to implement a device based on this concept. However, the leading method to write bits is a so-called "half-select" process in which the magnetic fields generated by two roughly orthogonal current carrying wires orient the free layer into its intended configuration. The amplitudes of the currents flowing through the two wires, referred to as the word and bit lines, are chosen so that the corresponding fields reverse a free layer only where the two wires intersect. Therefore, this method can select any individual cell within the array with a minimum of electrical wires and without unintentionally reversing the magnetic state of other cells. However, this writing scheme exhibits poor scaling with increasing areal density of cells.

SUMMARY

The present invention relates to a memory cell including a first reference layer having a first magnetization with a first magnetization direction and a second reference layer having a second magnetization with a second magnetization direction substantially perpendicular to the first magnetization direction. A storage layer is disposed between the first reference layer and second reference layer and has a third magnetization direction about 45° from the first magnetization direction and about 135° from the second magnetization direction when the memory cell is in a first data state, and a fourth magnetization direction opposite the third magnetization direction when the memory cell is in a second data state.

DETAILED DESCRIPTION

Figure 1:
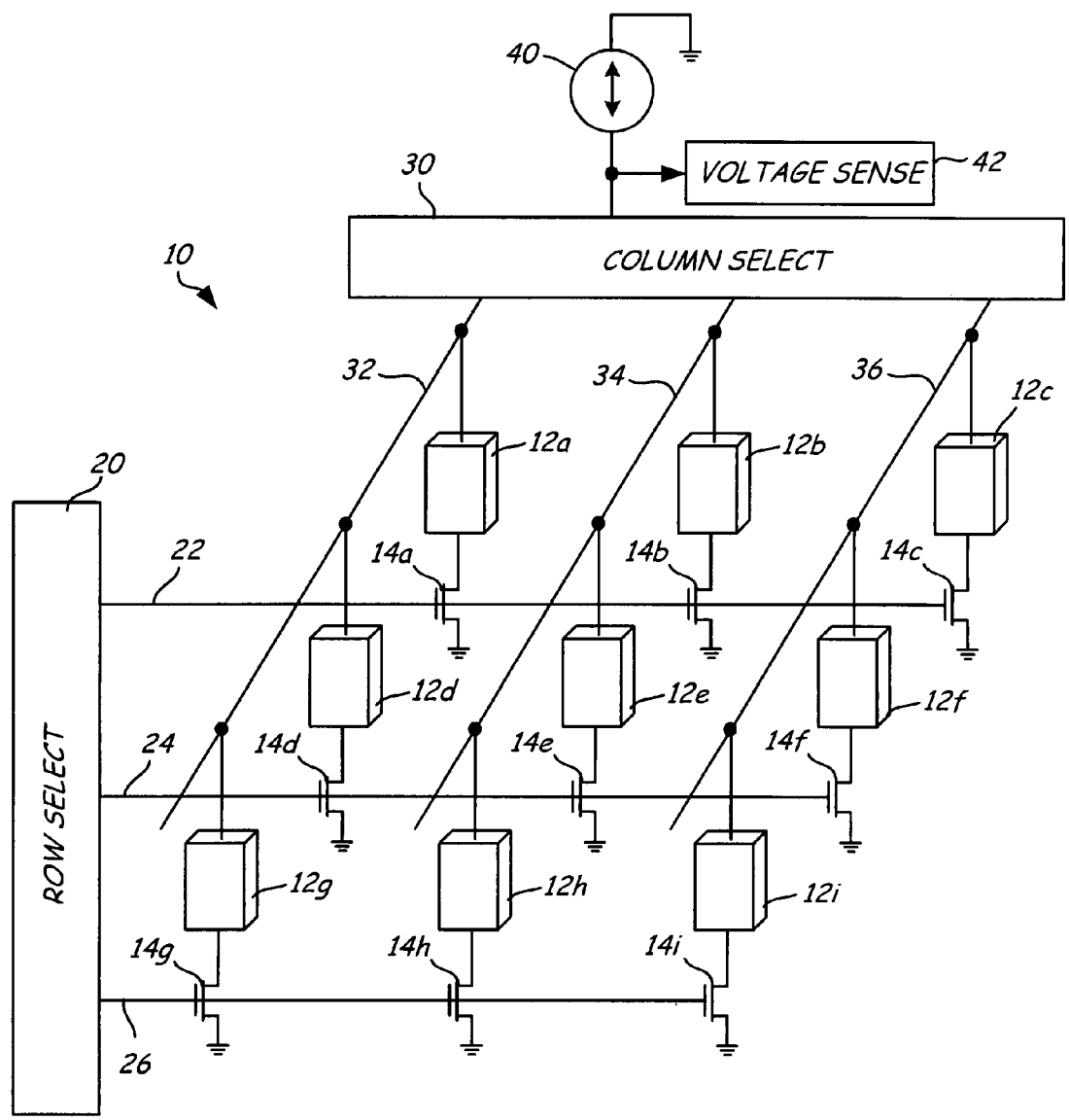
FIG. 1 is a schematic view of an array of memory cells in a magnetic memory system.

FIG. 1 is a schematic view of magnetic random access memory (MRAM) 10 including memory cells 12a, 12b, 12c, 12d, 12e, 12f, 12g, 12h, and 12i (collectively referred to as memory cells 12). A 3×3 array of memory cells 12 is shown for ease of illustration, but it will be appreciated that the array shown is a subset of a typical number of memory cells 12 in an MRAM device. MRAM 10 also includes transistors 14a, 14b, 14c, 14d, 14e, 14f, 14g, 14h, and 14i (collectively referred to as transistors 14), row select module 20, row select lines 22, 24, and 26, column select module 30, column select lines 32, 34, and 36, read/write current source 40, and voltage sensor 42.

Each transistor 14a-14i is connected between respective memory cell 12a-12i and ground. The gates of transistors 14a, 14b, and 14c are connected to row select line 22, the gates of transistors 14d, 14e, and 14f are connected to row select line 24, and the gates of transistors 14g, 14h, and 14i are connected to row select line 26. Memory cells 12a, 12d, and 12g are connected to column select line 32, memory cells 12b, 12e, and 12h are connected to column select line 34, and memory cells 12c, 12f, and 12i are connected to column select line 36. Current source 40 is selectably connected to column select lines 32, 34, and 36 via column select module 30. Voltage sensor 42 is connected to sense the voltage at column select module 30.

Memory cells 12a-12i each includes a magnetoresistive element that has a magnetization state corresponding to data written to the cell. To write data to a memory cell 12, the row and column select lines that intersect at the memory cell 12 to which data is to be written are activated by applying a voltage. For example, to write data to memory cell 12f, voltages are applied to row select line 24 by row select module 20 and to column select line 36 by column select module 30. By activating the row select line 24 and column select line 36 associated with the memory cell 12f, a current loop is provided through current source 40, memory cell 12f and transistor 14f. Current source 40 provides current perpendicular to the major plane of the layers of memory cell 12f. The magnetization state of memory cell 12f is a function of the direction of the current from current source 40 through memory cell 12f. More specifically, a first magnetization state is written to memory cell 12f when current is provided through memory cell 12f in a first direction, and a second magnetization state is written to memory cell 12f when current is provided through memory cell 12f in a second direction opposite the first direction.

In order to read data from a memory cell 12, the row and column select lines that intersect at the memory cell 12 from which data is to be read are activated by applying a voltage. For example, to read data from memory cell 12g, voltages are applied to row select line 26 by row select module 20 and to column select line 32 by column select module 30. Current source 40 then provides current through memory cell 12g, and the voltage across memory cell 12g is measured by voltage sensor 42. Voltage sensor 42 senses changes in the voltage due to resistance changes across memory cell 12g induced by the applied current. Based on the voltage response of memory cell 12g to the applied current, the magnetization state of memory cell 12g may be determined.

Figure 2:
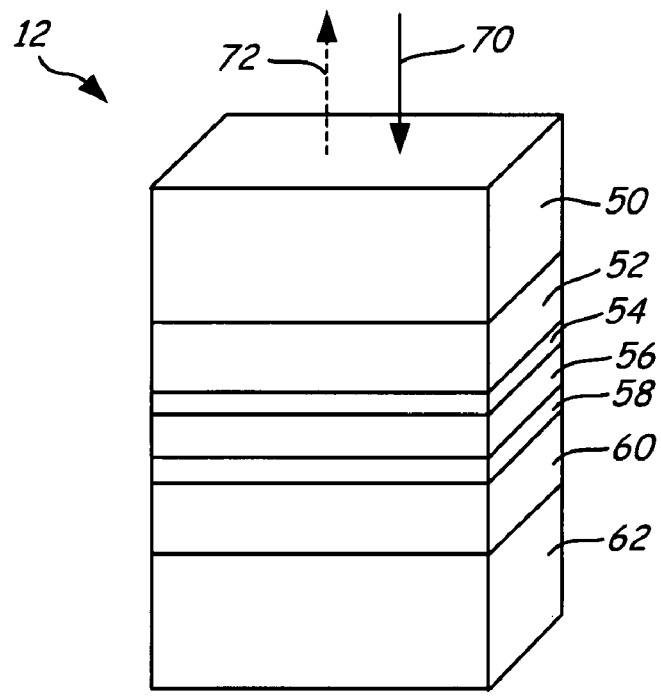
FIG. 2 is a perspective view of a memory cell including a free layer positioned between two reference layers.

FIG. 2 is a perspective view of memory cell 12 including first biasing or pinning layer 50, first reference or pinned layer 52, first spacer layer 54, storage or free layer 56, second spacer layer 58, second reference or pinned layer 60, and second biasing or pinning layer 62. First biasing layer 50 and second biasing layer 62 may be comprised of an antiferromagnetic material, such as Ru, PtMn, IrMn, NiMn, FeMn, RhMn, and RuRhMn. First reference layer 52, storage layer 56, and second reference layer 60 may be comprised of a ferromagnetic material, such as CoFe, NiFe or NiFeCo. First spacer layer 54 and second spacer layer 58 may be comprised of a nonmagnetic conductive material, such as Au, Ag, NiFeCr, Al, and Ru, such that memory cell 12 provides a giant magnetoresistive (GMR) response. First spacer layer 54 and second spacer layer 58 may alternatively be comprised of an insulating material, such as a metal oxide including $Al_2O_3$, MgO, $HfO_2$, $Y_2O_3$, $TiO_2$ or $ZrO_2$, such that memory cell 12 provides a tunneling magnetoresistive (TMR) response.

First biasing layer 50 sets or pins the magnetization of first reference layer 52 in a first magnetization direction, and second biasing layer 62 sets or pins the magnetization of second reference layer 60 in a second magnetization direction. In some embodiments, the first magnetization direction is substantially perpendicular to the second magnetization direction. In an alternative embodiment, first biasing layer 50 and second biasing layer 62 may be eliminated and the magnetizations of first reference layer 52 and second reference layer 60 may be pinned due to the shape anisotropy of these layers.

As described above, when writing to memory cell 12, the magnetization direction of storage layer 56 is a function of the direction of current from current source 40 applied to memory cell 12. When current from current source 40 is directed through memory cell 12 in a first direction (shown as current direction 70 in FIG. 2), the magnetization of storage layer 56 is set in a first direction corresponding to a first data state. When current from current source 40 is directed through memory cell 12 in a second direction opposite the current direction 70 (shown as current direction 72 in FIG. 2), the magnetization of storage layer 56 is set in a second direction corresponding to a second data state. The magnetization direction of storage layer 56 is responsive to the applied current due to the spin transfer effect, in which the applied current transfers spin angular momentum from an adjacent reference layer to storage layer 56, which causes the magnetization of storage layer 56 to rotate. The strength of the torque on the magnetization of storage layer 56 is directly proportional to the current density through memory cell 12. Therefore, for a given current, the current density will increase as the area of memory cell 12 decreases in size, and spin transfer will become more efficient as the density of MRAM 10 increases.

Figure 3:
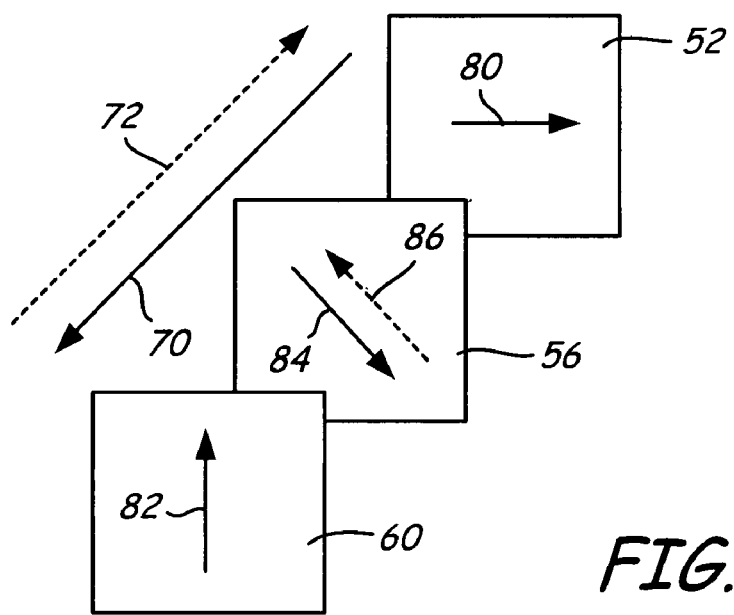
FIG. 3 is an exploded plan view of the free layer and the two reference layers showing their relative magnetization states as a function of an applied current.

To illustrate, FIG. 3 is an exploded plan view of first reference layer 52, storage layer 56, and second reference layer 60 showing the relative magnetization directions of these layers. In the embodiment shown, first reference layer 52 has a magnetization direction 80, and second reference layer 60 has a magnetization direction 82 substantially perpendicular to magnetization direction 80. When current from current source 40 is directed through memory cell 12 in current direction 70, the current is spin polarized by first reference layer 52, and spin angular momentum from the spin polarized current is transferred to storage layer 56. This causes the magnetization of storage layer 56 to orient in magnetization direction 84. In the embodiment shown, magnetization direction 84 is about 45° from magnetization direction 80 and about 135° from magnetization direction 82. When the magnetization of storage layer 56 is arranged in this way, memory cell 12 stores a first data state (i.e., a "0" bit).

When current from current source 40 is directed through memory cell 12 in current direction 72, the current is spin polarized by second reference layer 60, and spin angular momentum from the spin polarized current is transferred to storage layer 56. This causes the magnetization of storage layer 56 to orient in magnetization direction 86, which is opposite or antiparallel to magnetization direction 84. In the embodiment shown, magnetization direction 86 is about 135° from magnetization direction 80 and about 45° from magnetization direction 82. When the magnetization of storage layer 56 is arranged in this way, memory cell 12 stores a second data state (i.e., a "1" bit).

Figure 4A:
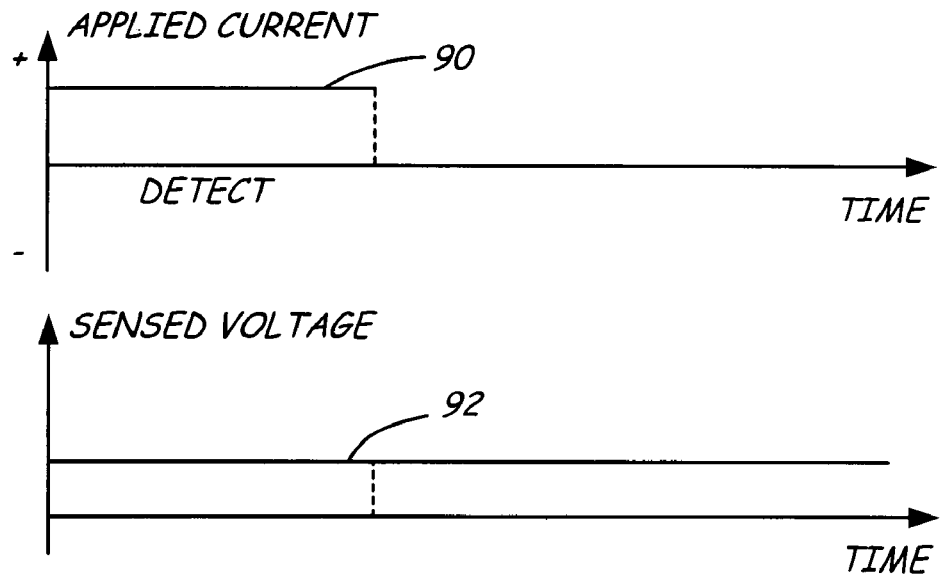
FIG. 4A is a graph showing the response of the memory cell in a first data state to an applied current.

In order to read data from memory cell 12, current from current source 40 is applied in current direction 70 through memory cell 12, and the voltage across memory cell 12 is measured by voltage sensor 42. FIG. 4A is a graph showing the response of memory cell 12 to the applied current when memory cell 12 is in the first data state. As described above, a current applied in current direction 70 writes data in memory cell 12 to the first data state. Thus, when the current is applied in current direction 70 (line 90), the voltage sensed across memory cell 12 remains substantially constant during a detect period (line 92) since the magnetization state of storage layer 56 is unchanged by the applied current. The constant voltage measured by voltage sensor 42 is detected to read the first data state from memory cell 12.

Figure 4B:
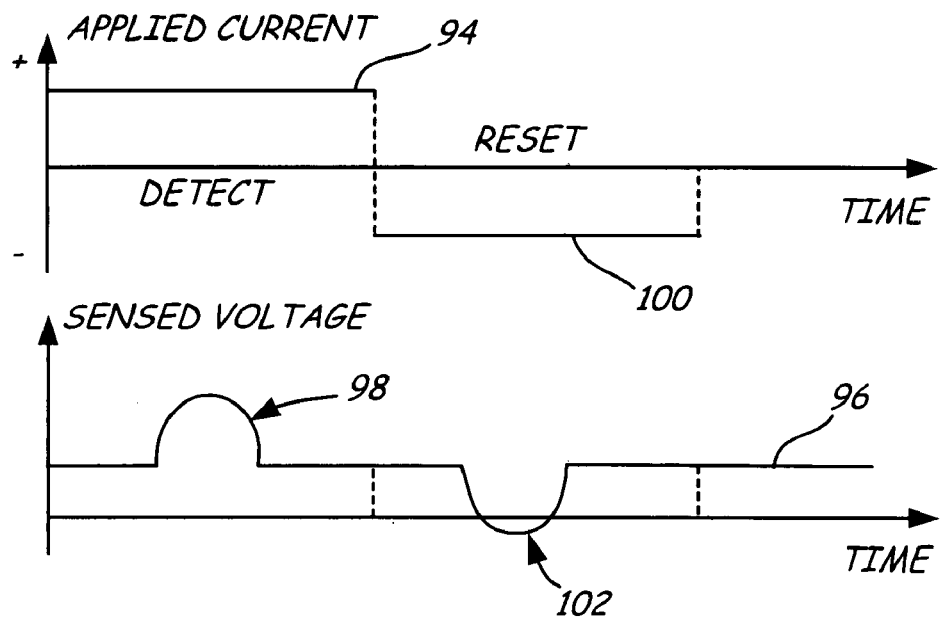
FIG. 4B is a graph showing the response of the memory cell in a second data state to an applied current.

FIG. 4B is a graph showing the voltage response of memory cell 12 when current from current source 40 is applied in current direction 70 when memory cell 12 is in the second data state. Again, a current applied in current direction 70 writes data in memory cell 12 to the first data state. Thus, when current is applied in current direction 70 (line 94), the voltage sensed across memory cell (line 96) changes as the magnetization of storage layer 56 rotates from magnetization direction 84 to magnetization direction 86 during the detect period. This change in sensed voltage, illustrated as pulse 98 in FIG. 4B, is detected to read the second data state from memory cell 12.

In response to the change in magnetization direction in storage layer 56 induced by the applied current, memory cell 12 is reset to its data state immediately prior to the read process by applying a current to memory cell 12 in current direction 72. To assure that memory cell 12 is accurately re-written to its correct state, voltage sensor 42 may sense the voltage across memory cell 12. When current is applied in current direction 72 during a reset period (line 100), the voltage sensed across memory cell 12 again changes as the magnetization of storage layer 56 rotates back from magnetization direction 86 to magnetization direction 84. This change in sensed voltage, illustrated as pulse 102 in FIG. 4B, is detected to verify that the second data state is re-written to memory cell 12.

Memory cell 12 allows information to be written to and read from memory cell 12 using the same applied current. Also, the applied current necessary to induce switching of data states during the write process is significantly reduced over existing designs, and the amplitude of the voltage pulse during the read process is significantly increased for improved detectability. In addition, manufacturing of memory cell 12 is simple, since the magnetizations of reference layers 52 and 60 may be set by rotating the wafer after fabrication of reference layer 60 such that the reference layer 52 is later fabricated with a magnetization substantially perpendicular to that of reference layer 60. Furthermore, inter-cell interference in a magnetic memory system including a plurality of memory cells 12 is substantially eliminated.

In summary, the present invention relates to a memory cell including a first reference layer having a first magnetization with a first magnetization direction and a second reference layer having a second magnetization with a second magnetization direction substantially perpendicular to the first magnetization direction. A storage layer is disposed between the first reference layer and second reference layer and has a third magnetization direction about 45° from the first magnetization direction and about 135° from the second magnetization direction when the memory cell is in a first data state, and a fourth magnetization direction opposite the third magnetization direction when the memory cell is in a second data state.

Although the present invention has been described with reference to preferred embodiments, workers skilled in the art will recognize that changes may be made in form and detail without departing from the spirit and scope of the invention.

The invention claimed is:

1. An apparatus comprising:
    a first reference layer having a first magnetization with a first magnetization direction;
    a second reference layer having a second magnetization with a second magnetization direction substantially perpendicular to the first magnetization direction;
    a storage layer disposed between the first reference layer and second reference layer, the storage layer comprising either a first data state or a second data state, the first data state comprising a third magnetization about 45° from the first magnetization direction and about 135° from the second magnetization direction and the second data state comprising a fourth magnetization direction opposite the third magnetization direction;
    the first reference layer, the second reference layer and the storage layer being configured to receive current in a first direction to maintain the first data state and in a second direction opposite the first direction to maintain the second data state; and
    a circuit which detects whether the storage layer is in the first or second data state during a read operation and further provides current through the storage layer to write the storage layer back to the first or second data state immediately prior to the read operation in response to detecting that the memory cell was changed to the first or second data state by the read operation.

2. The apparatus of claim 1, further comprising:
    a first nonmagnetic layer between the first reference layer and the storage layer; and
    a second nonmagnetic layer between the second reference layer and the storage layer.

3. The apparatus of claim 2, wherein the first nonmagnetic layer and the second nonmagnetic layer are selected from the group consisting of an insulating barrier layer and a conductive spacer layer.

4. The apparatus of claim 2, wherein at least one of the first nonmagnetic layer and the second nonmagnetic layer is comprised of a material selected from the group consisting of Au, Ag, NiFeCr, Al, Ru, $Al_2O_3$, MgO, $HfO_2$, $Y_2O_3$, $TiO_2$ and $ZrO_2$.

5. The apparatus of claim 1, wherein the reference layers are comprised of ferromagnetic material.

6. The apparatus of claim 1, further comprising:
    a first pinning layer to pin the first magnetization in the first magnetization direction; and
    a second pinning layer to pin the second magnetization in the second magnetization direction.

7. The apparatus of claim 1, wherein at least one of the first reference layer and the second reference layer is comprised of a material selected from the group consisting of CoFe, NiFe, and NiFeCo.

8. A magnetic memory system comprising:
    a memory cell having first and second data states, the memory cell including a first reference layer having a first magnetization direction, a second reference layer having a second magnetization direction substantially perpendicular to the first magnetization direction, and a storage layer disposed between the first reference layer and second reference layer, wherein a magnetization of the storage layer is maintained in a third magnetization direction about 45° from the first magnetization direction and about 135° from the second magnetization direction in response to current through the memory cell in a first direction to establish the first data state, and wherein the storage layer is maintained in a fourth magnetization direction opposite the third magnetization direction in response to current through the memory cell in a second direction opposite the first direction to establish the second data state; and
    a circuit for directing a read/write current through the memory cell during a write operation in the first and second directions as a function of a data state to be written to the memory cell, and for directing the read/write current through the memory cell and measuring a voltage across the memory cell during a read operation to determine whether the memory cell is in the first or second data state, the circuit further providing the read/write current through the memory cell to write the memory cell back to the first or second data state immediately prior to the read operation in response to detecting that the memory cell was changed to the first or second data state by the read operation.

9. The magnetic memory system of claim 8, further comprising:
    a first nonmagnetic layer between the first reference layer and the storage layer; and
    a second nonmagnetic layer between the second reference layer and the storage layer.

10. The magnetic memory system of claim 9, wherein the first nonmagnetic layer and the second nonmagnetic layer are selected from the group consisting of an insulating barrier layer and a conductive spacer layer.

11. The magnetic memory system of claim 9, wherein at least one of the first nonmagnetic layer and the second nonmagnetic layer is comprised of a material selected from the group consisting of Au, Ag, NiFeCr, Al, Ru, $Al_2O_3$, MgO, $HfO_2$, $Y_2O_3$, $TiO_2$ and $ZrO_2$.

12. A memory cell comprising:
    a first reference layer having a first magnetization that is fixed in a first magnetization direction;
    a second reference layer having a second magnetization that is fixed in a second magnetization direction substantially perpendicular to the first magnetization direction; and
    a storage layer disposed between the first reference layer and second reference layer, the storage layer comprising either a first data state or a second data state, the first data state comprising a third magnetization direction about 45° from the first magnetization direction and about 135° from the second magnetization direction, and the second data state comprising a fourth magnetization direction opposite the third magnetization direction;
    the first reference layer, the second reference layer and the storage layer being configured to receive current in a write operation in a first direction to maintain the first data state and in a second direction opposite the first direction to maintain the second data state, and to receive current in a read operation wherein a voltage across the memory cell indicates the data state of the storage layer to be in the first or second data state; and
    the storage layer being further configured to return to either the third magnetization direction or the fourth magnetization direction in response to detecting that the storage layer changed from the first or second data state by the read operation by directing current through the memory cell in a write operation in a direction opposite the current received in the read operation.

13. The memory cell of claim 12, wherein the current in the write operation and the current in the read operation are approximately equal.

14. The memory cell of claim 12, further comprising:
a first nonmagnetic layer between the first reference layer and the storage layer; and
a second nonmagnetic layer between the second reference layer and the storage layer.

15. The memory cell of claim 14, wherein the first nonmagnetic layer and the second nonmagnetic layer are selected from the group consisting of an insulating barrier layer and a conductive spacer layer.

16. The memory cell of claim 14, wherein at least one of the first nonmagnetic layer and the second nonmagnetic layer is comprised of material selected from the group consisting of Au, Ag, NiFeCr, Al, Ru, $Al_2O_3$, MgO, $HfO_2$, $Y_2O_3$, $TiO_2$ and $ZrO_2$.

17. The memory cell of claim 12, wherein at least one of the first reference layer and the second reference layer is comprised of materials selected from the group consisting of CoFe, NiFe, and NiFeCo.

* * * * *